United States Patent
Beinglass et al.

(10) Patent No.: US 7,401,066 B2
(45) Date of Patent: Jul. 15, 2008

(54) CORRELATION OF END-OF-LINE DATA MINING WITH PROCESS TOOL DATA MINING

(75) Inventors: Israel Beinglass, Sunnyvale, CA (US); Amir Feili, Santa Clara, CA (US); Amos Dor, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 251 days.

(21) Appl. No.: 10/105,607

(22) Filed: Mar. 21, 2002

(65) Prior Publication Data

US 2003/0182252 A1    Sep. 25, 2003

(51) Int. Cl.
*G06F 17/30* (2006.01)
*G06F 17/50* (2006.01)

(52) U.S. Cl. .............................. 707/2; 707/100; 716/4; 700/100; 710/121; 710/302; 710/304

(58) Field of Classification Search ................. 356/601; 707/6, 2, 100; 709/202, 394, 224; 716/4, 716/19; 700/100; 710/121, 302, 304; 711/133
See application file for complete search history.

(56) References Cited

U.S. PATENT DOCUMENTS

| | | | |
|---|---|---|---|
| 5,097,141 A | 3/1992 | Leivian et al. | 307/201 |
| 5,222,210 A | 6/1993 | Leivian | 395/161 |
| 5,819,245 A | 10/1998 | Peterson et al. | 706/16 |
| 5,897,627 A | 4/1999 | Leivian et al. | 706/12 |
| 6,314,379 B1 | 11/2001 | Hu et al. | 702/81 |
| 6,526,547 B2 * | 2/2003 | Breiner et al. | 716/4 |
| 6,580,960 B1 | 6/2003 | Nicholson | 700/121 |
| 2001/0051836 A1 | 12/2001 | Lamey, Jr. et al. | |
| 2002/0022937 A1 | 2/2002 | Funakoshi | |
| 2002/0032888 A1 | 3/2002 | Ott et al. | |

FOREIGN PATENT DOCUMENTS

| | | |
|---|---|---|
| DE | 10032322 | 1/2002 |
| WO | 0233745 A2 | 4/2002 |

OTHER PUBLICATIONS

Mike Gardner et al, Data mining solves tough semiconductor manufacturing problems, Year of Pub: 2000, ACM Press, pp. 376-383.*
James Pak et al., Advance Methods for Analysis of Lot-to-Lot Yiel Variation, 1997, IEEE, pp. E17-E20.*

(Continued)

*Primary Examiner*—Jean B Fleurantin
*Assistant Examiner*—Fred I Ehichioya
(74) *Attorney, Agent, or Firm*—Blakely, Sokoloff, Taylor and Zafman

(57) ABSTRACT

One embodiment of the present invention is a process tool optimization system that includes: (a) a data mining engine that analyzes end-of-line yield data to identify one or more process tools associated with low yield; and (b) in response to output from the analysis, analyzes process tool data from the one or more process tools to identify one or more process tool parameters associated with the low yield.

22 Claims, 1 Drawing Sheet

OTHER PUBLICATIONS

Fan et al., Data Mining and Fault Diagnosis on Wafer Acceptence Test Data and In-line Manufacturing Data, 2001, IEEE, pp. 171-174.*

Mieno et al., Yield Improvement Using Mining System, 1999, IEEE, pp. 391.*

Peter Borden, The Nature of Particule Generation in Vacuum Process Tools, 1990, IEEE, pp. 189-194.*

Fan et al., Shewma: An End-of-Line SPC Scheme Using Wafer Acceptance Test Data, 2000, IEEE, pp. 344-358.*

Guo et al., Intelligent Process Diagnosis Based on End-of-Line Electrical Test Data, 1996, IEEE, pp. 347-354.*

Perfecto et al., Improving Yields Through Effective Diagnostics: A MCM-D/C Example, 1998, IEEE, pp. 80-86.*

"Automatic in-line to end-of-line defect correlation using FSRAM test structure for quick killer defect identification" by D. Wilson et al., Proc. IEEE 1994 Intl. Conf. Microelectron. Test Structures, vol. 7, Mar. 1994, pp. 160-163.

"Predictive process control for sub-0.2 um lithography," T. E. Zavecz et al. *SPIE Microlithography*, vol. 3998, No. 48, Mar. 2000.

"Data Mining for Yield Improvements" R. Kittler et al., *Proc. Int'l Conf. on Modeling and Analysis of Semiconductor Manuf (MASM2000)*, May 2000.

"Solving Tough Semiconductor Manufacturing Problems Using GKS Data Mining Technology," M. Gardner et al., The 11th Annual IEEE/SEMI Advanced Semiconductor Manuf. Conf., Sep. 12-14, 2000, pp. 1-25.

* cited by examiner

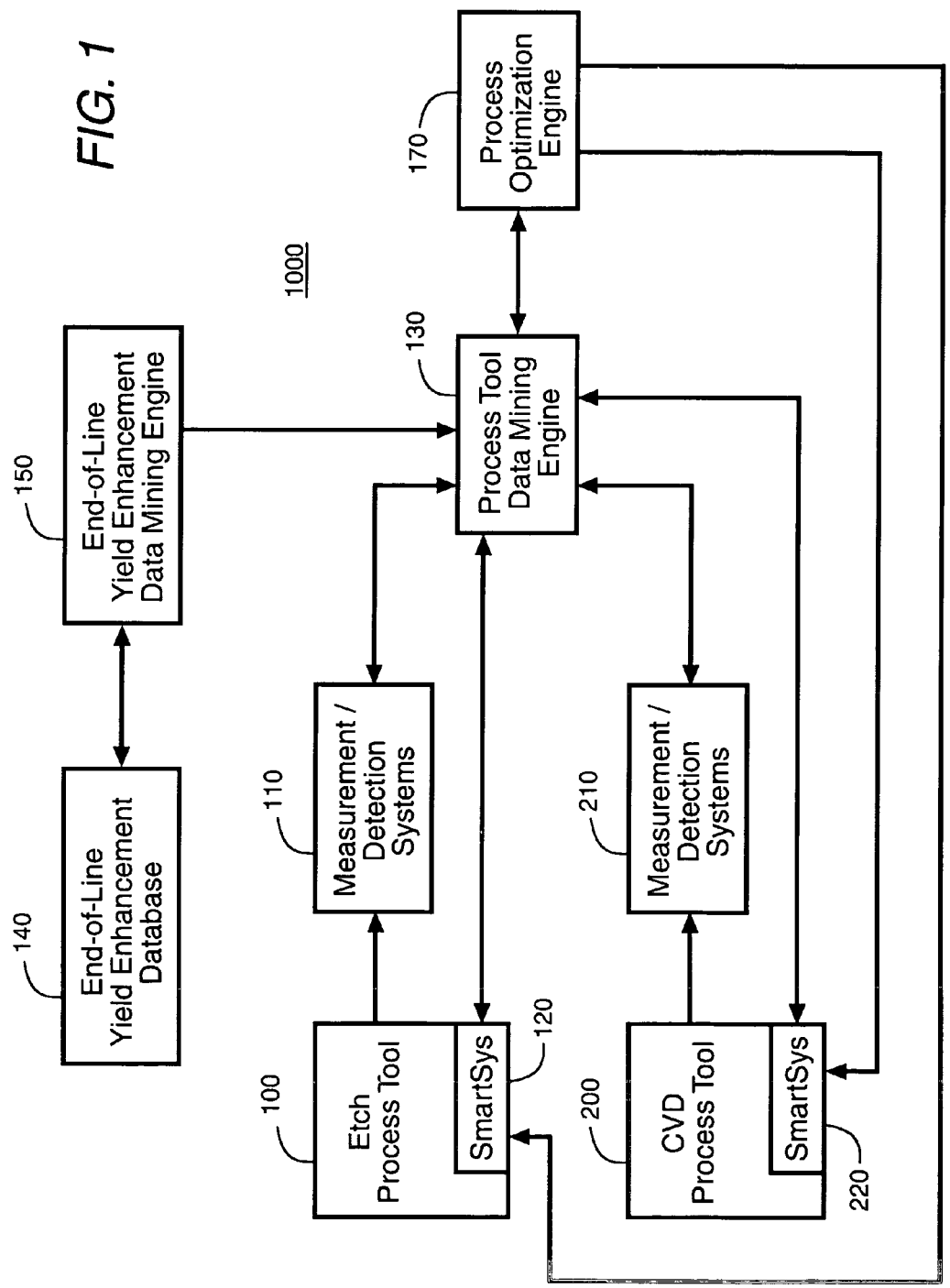

CORRELATION OF END-OF-LINE DATA MINING WITH PROCESS TOOL DATA MINING

TECHNICAL FIELD OF THE INVENTION

One or more embodiments of the present invention pertain to correlation of end-of-line data mining with process tool data mining.

BACKGROUND OF THE INVENTION

Semiconductor device manufacturing continues to become more complex as demands of the marketplace drive increasing circuit density. For example, a typical manufacturing process entails starting with a slice of single crystal silicon (referred to herein as a wafer or a substrate), and processing it through a series of from about 300 to about 500 individual manufacturing steps to produce many individual devices on each wafer. In addition, as circuit density increases, line widths shrink, and newer technology and materials are being used in semiconductor manufacturing. For example, copper processes are migrating from a 0.18 µm technology to a 0.13 µm technology. In addition, the advent of copper seed and electroplating, along with added difficulties in using new low-k films and the need to fill 0.13 um structures, present hurdles made no easier by a transition to use of 300 mm wafers.

As a result of this, reducing defectivity, be it process or contamination induced, is becoming increasingly more important, and one important factor in overcoming defectivity is time-to-root-cause. To monitor defectivity, and continuously reduce defect densities, semiconductor device manufacturers use defect data management software and defect detection equipment. Further, each new generation of semiconductor process technology demands more detailed data to support process monitoring and improvement. In turn, the wealth of data drives data storage, data integration, data analysis, and data automation trends in wafer processing.

Within the last few years, a good deal of investment has gone into the deployment of data extraction systems designed to record operating conditions of a given semiconductor wafer processing tool during the time a wafer is being processed. Although this temporal based process tool data is now available for some fraction of wafer processing tools in advanced factories, use of the data for optimizing tool performance relative to the devices (also referred to herein as integrated circuits or ICs) being produced has been limited. This limitation is due, at least in part, to a disconnect between how device performance data is represented relative to how process tool temporal data is represented. For example, data measurements on ICs are necessarily associated with a given batch of wafers (referred to as a lot), or a given wafer, or a given subset of ICs on the wafer. However, data measurements from process tool temporal data are represented as discrete operating conditions within the process tool at specific times during wafer processing. For example, if a factory process tool has an isolated chamber, then the chamber pressure might be recorded each millisecond while a given wafer remains in the process tool's chamber. In this example, the chamber pressure data for any given wafer would be recoded as a series of thousands of unique measurements. The difficulty associated with "merging" process tool temporal data to discrete data metrics has resulted in limited use of process tool temporal data as a means to optimize factory efficiency.

Many yield enhancement and factory efficiency improvement monitoring efforts today are focused on developing correlations between end-of-line functional test data that identify low yielding wafers and specific factory process tools used to make ICs. A goal of such an analysis is to identify individual process tool(s) suspected of causing the low yields, and to either remove it (them) from the factory processing flow until such time as yield engineers can be sure that the tool(s) is (are) operating "properly," modify the tool performance if necessary as wafers are being produced. It is well known to use data mining to perform these tasks (these types of correlation activities also play an important part in developing yield ramps on new technologies). These types of correlation activities can be tedious and time-consuming because of: (a) the massive amount of data being generated; and (b) the time it takes to consolidate data for analysis. Sometimes, it is a matter of trial and error before a signal is found. In addition, such activities typically do not provide sufficient information to enable process tools to be made to perform better. As a result, users typically spend more time trying to identify problems than spending efforts contributing to the actual fixing or adjusting process tools after they are identified.

In light of the above, there is a need for method and apparatus for solving one or more of the above-identified problems.

SUMMARY OF THE INVENTION

One or more embodiments of the present invention advantageously solve one or more of the above-identified problems. In particular, one embodiment of the present invention is a process tool optimization system that comprises: (a) a data mining engine that analyzes end-of-line yield data to identify one or more process tools associated with low yield; and (b) in response to output from the analysis, analyzes process tool data from the one or more process tools to identify one or more process tool parameters associated with the low yield.

BRIEF DESCRIPTION OF THE FIGURE

FIG. 1 shows a block diagram of a process tool optimization system that is fabricated in accordance with one embodiment of the present invention.

DETAILED DESCRIPTION

FIG. 1 shows process tool optimization system 1000 that is fabricated in accordance with one embodiment of the present invention. As is well known, after semiconductor wafers or substrates have devices (also referred to herein as integrated circuits or ICs) fabricated thereon, many functional tests, for example, and without limitation, electrical tests, are performed to determine whether the devices perform in accordance with design specifications. As shown in FIG. 1, in accordance with any one of a number of methods that are well known to those of ordinary skill in the art, results of such functional tests (i.e., collections of functional test results output from functional test apparatus) are stored in fab-wide, end-of-line, yield enhancement data base 140. Predetermined suites of functional tests and functional test apparatus for performing such functional tests are well known to those of ordinary skill in the art. It is noted that embodiments of the present invention are not limited to use in manufacturing devices on semiconductor wafers, and in fact, include embodiments that can also be used in manufacturing devices on other materials, for example, and without limitation, materials such as glass substrates or silica substrates, and so forth.

As further shown in FIG. 1, end-of-line, yield enhancement, data mining engine 150 retrieves data stored in fab-wide, end-of-line, yield enhancement data base 140, and analyzes the data to: (a) identify low yielding wafers; and (b) correlate the low yielding wafers with: (i) individual process tools or groups of process tools, (ii) temporal events, (iii) process and or device designs, and (iv) so forth. As used herein, the term low yield refers to a yield that falls below a predetermined amount, or to measurements that fall outside control limits or boundaries for a specific device parameters. As is well known, data mining is a family of well known methodologies that can be used to find patterns in (typically large sets of) data to help explain the behavior of one or more response variables. As is known, data mining differs from at least some methods of modeling in that there is no preconceived model to be tested. Rather, a model needs to be found using a preset range of explanatory variables. In general these variables may have a variety of different data-types, and include outliers and missing data. Some of the variables to be included in the model may be highly correlated, and the underlying relationships may be non-linear and include interactions.

As is further known, the term data mining has been associated with a number of different analytical techniques. Some of these techniques involve the use of traditional statistics, while others employ techniques such as neural nets, association rules, Bayesian networks, and decision trees. However, in all cases, an objective is to establish a model to explain variation of a response across a set of observations, together with an ability to predict accurately the response for new data encountered. Neural net models are useful when large amounts of data needed to be modeled and a physical model is not known well enough to use statistical methods. One of the downsides of the approach is that it is difficult to make a physical interpretation of the model parameters. Also, the predicted outcomes of the model are limited to the scope of the training set used. Bayesian networks are more physical than neural networks because the nodes in the network are measured variables, however, it is still difficult to extract elements of a physical model from the network or to effectively visualize the relationships embodied in it. Unlike neural networks, Bayesian networks can be used to discover new relationships. Association rules is a tool used to look for patterns of coincidence in data. For instance, how often do failing lots (i.e., a group of wafers) go through various combinations of process tools, for example, deposition process tool and etcher process tool combinations. Association rule analysis is useful in discovering patterns of behavior but does not produce a predictive model. Decision Trees are analytical tools for developing hierarchical models of behavior. A tree is built by iteratively evaluating which variable explains the most variability of the response based on a best rule involving the variable. Decision trees are useful when the relationships are not known, and when one needs to make broad categorical classifications or predictions. They are less useful when you need to make precise predictions for a continuous variable.

Output from end-of-line, yield enhancement, data mining engine 150 will identify one process tool, or combinations of process tools, that seem to be correlated with low yield. In accordance with prior art methods, this data was brought to the attention of maintenance personnel who then attempted to fix, or, at least try to troubleshoot, the identified tool or tools to improve the yield. However, in accordance with one embodiment of the present invention, as shown in FIG. 1, output from end-of-line, yield enhancement, data mining engine 150 is applied as input to process tool, data mining engine 130. End-of-line, yield enhancement, data mining engine 150 may be fabricated as a software application in accordance with any one of a number of methods that are well known to those of ordinary skill in the art. For example, end-of-line, yield enhancement, data mining engine 150 may be fabricated as a web-based software application that: (a) accesses data (for example, from fab-wide, end-of-line, yield enhancement data base 140) over a network such as, for example, and without limitation, the Internet, an intranet, and so forth; and (b) transmits data (for example, to process tool, data mining engine 130) over a network.

As shown in FIG. 1, etch process tool 100 processes wafers that are passed to measurement/detection systems 110, and chemical vapor deposition ("CVD") process tool 200 process wafers that are passed to measurement/detection systems 210. It should be understood that etch process tool 100 and CVD process tool 200 are merely representative examples of process tools whose output is analyzed in accordance with one or more embodiments of the present invention. As wafers are processed by etch process tool 100, process output data is collected by SMARTSys tool 120, and as wafers are processed by CVD process tool 200, process output data is collected by SMARTSys tool 220. A SMARTSys tool is a data collection and analysis tool manufactured by Applied Materials, Inc. of Santa Clara, Calif. that monitors process control parameters of a process tool. In addition, the SMARTSys tool further comprises applications to detect whether conditions are deviating from values conforming with a model of the process tool's optimum range. For example, one embodiment of the SMARTSys tool comprises an "equipment health monitoring and fault detection" application that evaluates a process tool's "health" index (i.e., an indicator) to optimize process tool performance. The equipment health monitoring and fault detection application does this by using historically based, multi-variate based models of expected behavior, and interactions among several predetermined variables—these variables can include equipment function parameters and/or process parameters (equipment function parameters and process parameters include equipment level data and process chamber data for the latter). For example, and without limitation, equipment function parameters include robot positions, and process parameters include temperature, vacuum pressure, RF amplitude, and gas flow. The SMARTSys tool monitors the predetermined indicators to detect whether conditions are deviating from optimum ranges of models of expected behavior. As such, these predetermined indicators help prevent wafer loss by predicting out-of-bound process behavior. The SMARTSys tool also collects, stores, and displays data in real time to ensure that process matrices and alarms are accurate.

As shown in FIG. 1, wafers processed by etch process tool 100 and CVD process tool 200, respectively, are transmitted to measurement/detection systems 110 and 210, respectively, for processing. Measurement/detection systems 110 and 210 comprise one or more of: (a) one or more parametric metrology tools; (b) one or more inspection tools; (c) one or more defect review systems; (d) a defect source identifier; and (e) a process knowledge library ("PKL"). As is well known, metrology and inspection tools produce measurement data, and defect measurement data that are used to verify process tool and device parameters. As is also well known, defect review systems, are tools that further analyze data produced by inspection tools to provide data indicative of sources of defects. A defect source identifier is equipment available from Applied Materials, Inc. of Santa Clara, Calif. that analyzes metrology data, inspection data, review data, and historical defect data to determine, or to provide assistance in determining, sources of defects. Lastly, a PKL is an application, for example, a software application, that can be fabricated in accordance with any one of a number of methods that are well known to those of ordinary skill in the art to provide specific knowledge of defects and particular corrective actions relating to out-of-limit process parameters pertaining to such defects. For example, the PKL might note that particular values of, for example, and without limitation, RF power are problematic for particular device designs.

As further shown in FIG. 1, process tool, data mining engine 130 accesses SMARTSys tool 120 and SMARTSys tool 220 to obtain at least a portion of the data stored therein. In addition, process tool, data mining engine 130 accesses measurement/detection systems 110 and measurement/detection systems 210 to obtain at least a portion of the data stored therein. The set of data obtained by process tool, data mining engine 130 is determined in response to input received from end-of-line, yield enhancement, data mining engine 150, and perhaps, in response to input from users such as, for example, yield engineers. For example, input from end-of-line, yield enhancement, data mining engine 150, and input from users, might indicate one or more process tools that are identified as being correlated with low yield. Such input from end-of-line, yield enhancement, data mining engine 150 might even indicate specific time periods during which the low yield is correlated. In response, process tool, data mining engine 130 will access process information for the indicated time periods from the relevant process tool (for example, by accessing a SMARTSys tool associated with the process tool), and will access relevant metrology, inspection, and review data stored in the relevant system (for example, by accessing measurement/detection systems 110 and/or measurement/detection systems 210, and/or the like). In addition, if particular types of data are not available automatically as described above, it may be supplied as files, for example, by user input, or by providing pre-configured designations of data locations. Further, maps indicating where predetermined data is stored (for example, a map of process tool and associated SMARTSys tool) may be obtained by system configuration processes in accordance with any one of a number of methods that are well known to those of ordinary skill in the art. Thus, when confronted with a new failure, process tool, data mining engine 130 would interrogate other automation components and metrology tools to gather the data needed to suggest a likely cause. Further, process tool, data mining engine 130 may be fabricated as a software application in accordance with any one of a number of methods that are well known to those of ordinary skill in the art. For example, process tool, data mining engine 130 may be fabricated as a web-based software application that: (a) accesses data (for example, from SMARTSys tool 120, SMARTSys tool 220, measurement/detection systems 110, and measurement/detection systems 210) over a network such as, for example, and without limitation, the Internet, an intranet, and so forth; and (b) outputs data over a network in a manner to be described below.

In accordance with one or more embodiments of the present invention, process tool, data mining engine 130 does data mining to develop intra-process tool related yield impact signals, and outputs yield impact signals 160 to process optimization engine 170, and/or provides correlations between specific device defects and out-of-limit process parameters to a PKL in the measurement/detection systems (for example, measurement/detection systems 110 or 210) associated with effected process tools for example, over a network. Thus, process tool, data mining engine 130 correlates end-of-line yield to specific process tool parameters such as, for example, and without limitation, pressure, temperature, RF amplitude, gas flow, and so forth. In doing this data mining, process tool, data mining engine 130 can use: (a) data from process tools that are identified by end-of-line, yield enhancement, data mining engine 150 as being correlated with low yield; (b) in certain instances, data (for example, for comparison purposes) from process tools that have not been identified as being correlated with low yield; and (b) historical data from process tools. The output from process tool, data mining engine 130 (i.e., yield impact signals 160) will identify process tool parameters, at least for the identified process tools, that are associated with low yield. These yield impact signals 160, i.e., precursors of failures, are applied as input to process optimization engine 170. Alternatively, they may be accessed by process optimization engine 170 from process tool, data mining engine 130.

Data mining may be performed by process tool, data mining engine 130 in accordance with any one of a number of methods that are well known to those of ordinary skill in the art. For example, the following considerations on performing data mining are well known, and may be kept in mind. Data mining requires data availability, reasonably efficient access methods, reasonable robustness to data problems, reasonably efficient algorithms, a reasonably high performance application server, and flexibility in delivering results. The sensitivity of various data mining methods to data problems must be considered when choosing a product or method for an application. In particular, data problems of concern are those due to gaps and measurements beyond the range of normal observation—so-called outliers. Though data mining methods have robustness to missing data, results will be improved when gaps can be avoided; but outliers are present in most real-world data sets. Data mining algorithms that use non-parametric methods (i.e., those that do not rely on normality of the underlying distribution) are less sensitive to outliers. "Cleaning" data prior to analysis can also avoid false signals due to outliers. For interactive use, it may be sufficient to deliver output to a diagram together with an ability to interact with the diagram to visualize underlying graphical relationships.

As shown in FIG. 1, process optimization engine 170 is a knowledge-based system such as, for example, and without limitation, an expert system, that uses yield impact parameters 160 as a set of rules with which to create a hierarchical knowledge system in accordance with any one of a number of methods that are well known to those of ordinary skill in the art that guides an optimization process. For example, if yield impact signals 160 comprise the pressure of etch process tool 100, then, process optimization engine 170 outputs feedback information to SMARTSys tool 120 to monitor the process pressure for excursions. The monitoring process will identify excursions, and a user can take corrective action which will increase yield. For example, such corrective may take the form of: (a) self-repair in the form of use of modified process recipes; (b) graceful shutdown before compromising the manufacturing process; and/or (c) preventative maintenance (PM). Advantageously, in accordance with one or more embodiments of the present invention, data mining can derive expert system-like diagnostic rules to suggest next steps, and allow faults to be isolated more efficiently. For example, PM anticipates the effects of wear and tear to replace parts before they fail and compromise a process. PM frequencies and special PMs are often dependent on processes, and recipe changes being performed. For instance, there may be interactions between recipe changes and process performance immediately after a change. These types of effects are difficult for a semiconductor equipment supplier to anticipate and test. However, they can have major effects on a semiconductor device manufacturer's success in using a process tool.

In addition, since it is appreciated that there are many factors that cause variability within a fab, and that these factors vary over time, it should be recognized that this variability creates constant change during processing steps. Therefore, correcting a single out-of-range incident does not provide long term optimization solution for an entire line forever. In other words, processes are dynamic, and they require constant monitoring and corrective action. In addition, as new devices are introduced into a process line, the entire line needs to have its yield optimized during production introduction and ramp. In using one or more embodiments of the present invention, process drifts are not only detected, but they may be corrected by feeding process corrections backward in the process flow. Thus, one or more embodiments of the present invention enables an increase in productivity of process tools during installation, as well as improvements once it is in place.

Although FIG. 1 shows an embodiment wherein SmartSys tools 120 and 220 each send information directly to process tool, data mining engine 130, other embodiments exist wherein other systems, for example, and without limitation, servers, exist that act as coordinators and/or central points for interaction between SmartSys tools and other systems and/or applications. In such an embodiment, information may be directed to process tool, data mining engine 130 through such servers.

Similarly, although FIG. 1 shows an embodiment wherein measurement/detection systems 110 and 210 each send information directly to process tool data mining engine 130, other embodiments exist wherein other systems, for example, and without limitation, servers, exist that act as coordinators and/or central points for interaction between measurement/detector systems and other systems and/or applications. In such an embodiment, information may be directed to process tool, data mining engine 130 through such servers. In addition, although FIG. 1 shows wafers being transferred from etch process tool 100 to measurement/detection systems 110 and wafers being transferred from CVD process tool 200 to measurement/detection systems 210, other embodiments exist wherein wafers output from various process tools are sent to the same measurement/detection systems. In further addition, as was described above, measurement/detection systems may comprise several different systems. As such, although FIG. 1 shows a single communication path between a measurement/detection systems and process tool, data mining engine 130, other embodiments exist wherein there are multiple communications paths between the individual systems which comprise the measurement/detection systems and process tool, data mining engine 130 (or there could be multiple communications paths between other systems such as, for example, and without limitation, servers that act as coordinators and/or central points for interaction between the various categories of systems that comprise the measurement/detection systems and other systems and/or applications).

Although FIG. 1 shows a communication path whereby end-of-line, yield enhancement data mining engine 150 transfers information to process tool, data mining engine 130, other embodiments exist where the information is stored at a node in a network, for example, and without limitation, in end-of-line, yield enhancement data base 140 or a server, and where process tool, data mining engine 130 accesses the information from the node in accordance with any one of a number of methods that are well known to those of ordinary skill in the art. Similarly, although FIG. 1 shows various communications paths between systems and tools, other embodiments exist wherein some or all of these communications paths take place between network nodes and/or servers in accordance with any one of a number of methods that are well known to those of ordinary skill in the art.

Although FIG. 1 shows an embodiment wherein process tool, data mining engine 130 and end-of-line, yield enhancement, data mining engine 150 are separate applications that are run on separate hardware1 other embodiments exist wherein they both run on the same hardware, and still other embodiments exist wherein they are the same application (for example, and without limitation, a data mining engine application) that may run processes having different algorithms (as such, it may process different sets of data at different times). The hardware may include memory to store data and at least one processor, coupled to the memory, to execute the one or more applications.

Those skilled in the art will recognize that the foregoing description has been presented for the sake of illustration and description only. As such, it is not intended to be exhaustive or to limit the invention to the precise form disclosed. For example, when it has been described above that information is transferred or transmitted between systems and/or applications and/or tools, this is meant to encompass embodiments wherein there is direct transfer or transmission and embodiments wherein there is indirect transfer or transmission as is the case where intermediaries are utilized such as network nodes, servers, and the like.

What is claimed is:

1. A process tool optimization system for process tools that process substrates, comprising:
    a memory to store end-of-line yield data, and at least one processor, coupled to the memory, to execute:
    an end-of-line data mining engine that to analyze the end-of-line yield data, and to identify one or more process tools and time periods associated with low yield;
    a process tool data mining engine to identify the one or more process tools associated with the low yield from the end-of-line data mining engine, to obtain process tool data from the identified one or more process tools in correlation with the data received from the end-of-line data mining engine, to analyze constantly during processing of the substratesthe process tool data from the identified one or more process tools, and to identify one or more process tool parameters associated with the low yield based on the analyzing and the data received from the end-of-line data mining engine; and
    a data collection tool to monitor process control parameters of one or more process tools, and to transmit one or more of the process tool data and an analysis of the process tool data to the process tool data mining engine, wherein the analysis is based on one or more models of expected tool behavior.

2. The system of claim 1 wherein the data collection tool comprises one or more distinct data collection tools, each of which is associated with a distinct process tool.

3. The system of claim 2 wherein the one or more data collection tools comprises one or more applications to detect whether predetermined process conditions deviate from predetermined ranges.

4. The system of claim 2 wherein the one or more data collection tools comprises one or more applications to determine predetermined process tool performance indicators.

5. The system of claim 1 which further comprises measurement/detection systems to transmit one or more of measurement data, defect measurement data, defect review data, and defect source data to the process tool data mining engine.

6. The system of claim 5 wherein one or more of the measurement/detection systems comprises one or more of a parametric metrology tool, an inspection tool, a defect review system, a defect source identifier, and a process knowledge library.

7. The system of claim 1 wherein the process tool data mining engine is further to transmit information relating to the one or more process tool parameters associated with the low yield to a process optimization engine.

8. The system of claim 7 wherein the process optimization engine is a knowledge-based system that, in response to the information relating to the one more process tool parameters, creates a hierarchical knowledge system.

9. The system of claim 8 which further comprises a data collection tool to monitor process control parameters of one or more process tools, and to transmit one or more of the process tool data and an analysis of the process tool data to the process tool data mining engine; and wherein the process optimization engine is further to transmit process control information for one or more process tools to the data collection tool.

10. The system of claim 9 wherein the data collection tool uses the process control information for the one or more process tools to monitor the one or more process tools.

11. The system of claim 1 wherein the process tool data mining engine is further to transmit information relating to the one or more process tool parameters associated with the low yield to one or more of a defect source identifier and a process knowledge library associated with the one or more process tools associated with low yield.

12. The system of claim 1 wherein the process tool data mining engine, in response to output from the end-of-line data mining engine, is to analyze one or more of process tool data from the one or more process tools associated with low yield, process tool data from one or more other process tools, and historical process tool data.

13. The system of claim 1, wherein the end-of-line data mining engine and the process tool data mining engine are separate applications run on separate hardware.

14. The system of claim 1, wherein the end-of-line data mining engine and the process tool data mining engine are respective application that run on the same a hardware.

15. The system of claim 1, wherein the end-of-line data mining engine and the process tool data mining engine are the same data mining engine.

16. A computer-implemented method comprising:
processing substrates in one or more process tools;
analyzing end-of-line yield data using an end-of-line data mining engine to identify at least one of said process tools and time periods associated with low yield;
obtaining process data from the identified at least one of said process tools associated with low yield in correlation with the end-of-line yield data;
analyzing the process tool data from the at least one of said process tools;
identifying one or more process tool parameters associated with the low yield based on the analyzing of end-of-line yield data and the analyzing of the process tool data;
monitoring process control parameters of one or more pros tools with a data collection tool; and
transmitting one or more of the process tool data and an analysis of the process tool data to a process tool data mining engine, wherein the analysis is based on one or more models of expected tool behavior, wherein the analyzing of the process tool data is performed constantly during processing of the substrates.

17. A process tool optimization system for a manufacturing system in which substrates are processed by one or more process tools, comprising:
a memory to store data, and at least one processor, coupled to the memory, to execute:
a process tool data mining engine to receive process information from at least one of said process tools during processing of the substrates, wherein the process tool data mining engine outputs yield impact signals that are precursors of process tool failures associated with low yield;
a process optimization engine to receive said yield impact signals from the process tool data mining engine; and
a data collection tool to monitor process control parameters of one or more process tools, and to transmit one or more of the process tool data and an analysis of the process tool data to the process tool data mining engine, wherein the analysis is based on one or more models of expected tool behavior,
wherein, in response to receiving said yield impact signals that are precursors of process tool failures, the process optimization engine identifies process tool parts that should be replaced before they fail.

18. A system according to claim 17, further comprising:
an end-of-line data mining engine connected to provide to the process tool data mining engine an output data that identifies a process tool correlated with low yield;
wherein the process tool data mining engine outputs said yield impact signals in response to the output data provided by the end-of-line data mining engine.

19. A process tool optimization system for optimizing the yield of a factory process flow in which substrates are processed by one or more process tools, comprising:
a memory to store data, and at least one processor, coupled to the memory, to execute:
a process tool data mining engine to receive process information from at least one of said process tools during processing of the substrates, wherein the process tool data mining engine outputs yield impact signals that identify process tool parameters associated with low yield;
a process optimization engine to receive said yield impact signals from the process tool data mining engine and to output feedback information to at least one of said process tools; and
a data collection tool to monitor process control parameters of one or more process tools, and to transmit one or more of the process tool data and an analysis of the process tool data to the process tool data mining engine, wherein the analysis is based on one or more models of expected tool behavior,
wherein, during processing steps performed by said process tools, the process tool data mining engine and the process optimization engine perform constant monitoring and corrective actions for process tools with the identified process tool parameters associated with the low yield by feeding process corrections backward in the process flow.

20. A system according to claim 19, further comprising:
an end-of-line data mining engine connected to provide to the process tool data mining engine an output data that identifies a process tool correlated with low yield;
wherein the process tool data mining engine outputs said yield impact signals in response to the output data provided by the end-of-line data mining engine.

21. A process tool optimization system for a manufacturing system in which substrates are processed by one or more process tools, comprising:
    a memory to store data, and at least one processor, coupled to the memory, to execute:
    a process tool data mining engine to receive process information from said process tools during processing of the substrates, wherein the process tool data mining engine outputs yield impact signals that identify process tool parameters associated with low yield;
    a data collection tool to monitor process control parameters of one or more process tools, and to transmit one or more of the process tool data and an analysis of the process tool data to the process tool data mining engine, wherein the analysis is based on one or more models of expected tool behavior; and
    a process optimization engine, wherein:
        (i) the process optimization engine to receive said yield impact signals from the process tool data mining engine;
        (ii) to process optimization engine to output feedback information to said process tools;
        (iii) in response to receiving yield impact signals identifying a parameter of one of the process tools that is associated with low yield, the process optimization engine to output feedback to said one process tool; and
        (iv) the feedback directs said one process tool to monitor said parameter associated with the low yield.

22. A system according to claim 21, further comprising:

an end-of-line data mining engine connected to provide to the process tool data mining engine an output data that identifies a process tool correlated with low yield;

wherein the process tool data mining engine outputs said yield impact signals in response to the output data provided by the end-of-line data mining engine.

* * * * *